United States Patent [19]

Iwakiri et al.

[11] 4,196,348
[45] Apr. 1, 1980

[54] CONTACTLESS SNAP-ACTION PHOTOELECTRIC SWITCH

[75] Inventors: Norio Iwakiri, Otokuni; Yasuhiro Kiyono, Nagaokakyo, both of Japan

[73] Assignee: Omron Tateisi Electronics, Co., Kyoto, Japan

[21] Appl. No.: 886,107

[22] Filed: Mar. 13, 1978

[30] Foreign Application Priority Data

Mar. 12, 1977 [JP] Japan .................................. 52-27455
Mar. 12, 1977 [JP] Japan .................................. 52-27456
Mar. 12, 1977 [JP] Japan .................................. 52-27457

[51] Int. Cl.² .......................................... G01D 5/34
[52] U.S. Cl. ........................... 250/229; 340/365 P
[58] Field of Search ...................... 250/229, 551; 340/365 P; 29/622

[56] References Cited

U.S. PATENT DOCUMENTS

| | | | |
|---|---|---|---|
| 3,189,703 | 6/1965 | Chapin et al. | 200/67 |
| 3,263,306 | 8/1966 | Chapin et al. | 29/155.5 |
| 3,628,037 | 12/1971 | Yamamoto et al. | 250/229 |
| 3,660,669 | 5/1972 | Grenon | 250/551 |
| 3,842,263 | 10/1974 | Kornrumpf et al. | 250/239 |
| 4,047,045 | 9/1977 | Paxton, Jr. et al. | 250/551 |

FOREIGN PATENT DOCUMENTS

1040292 8/1966 United Kingdom ............... 250/239

*Primary Examiner*—David C. Nelms
*Assistant Examiner*—Edward P. Westin
*Attorney, Agent, or Firm*—Stevens, Davis, Miller & Mosher

[57] ABSTRACT

A contactless switch which comprises a paired light-emitting diode and photoelectric transistor and a shutter means for temporarily blocking light passing from the diode to the transistor. A method for the production of this switch is also described. The above diode and transistor are mounted on terminal members stamped in a metal strip, which terminal members are connected by webs as molded but trimmed off from each other in assembling. The terminal members are embedded at least partially in a switch base made of plastic material and bent to bring said diode and transistor in confronting relation. The snap action means is associated with an actuator.

6 Claims, 14 Drawing Figures

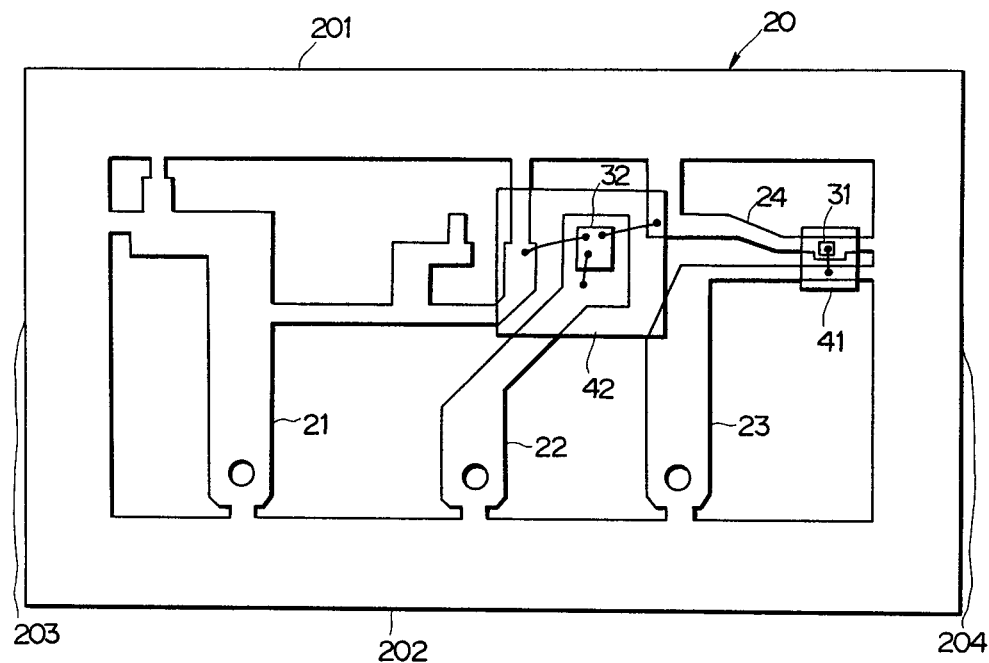
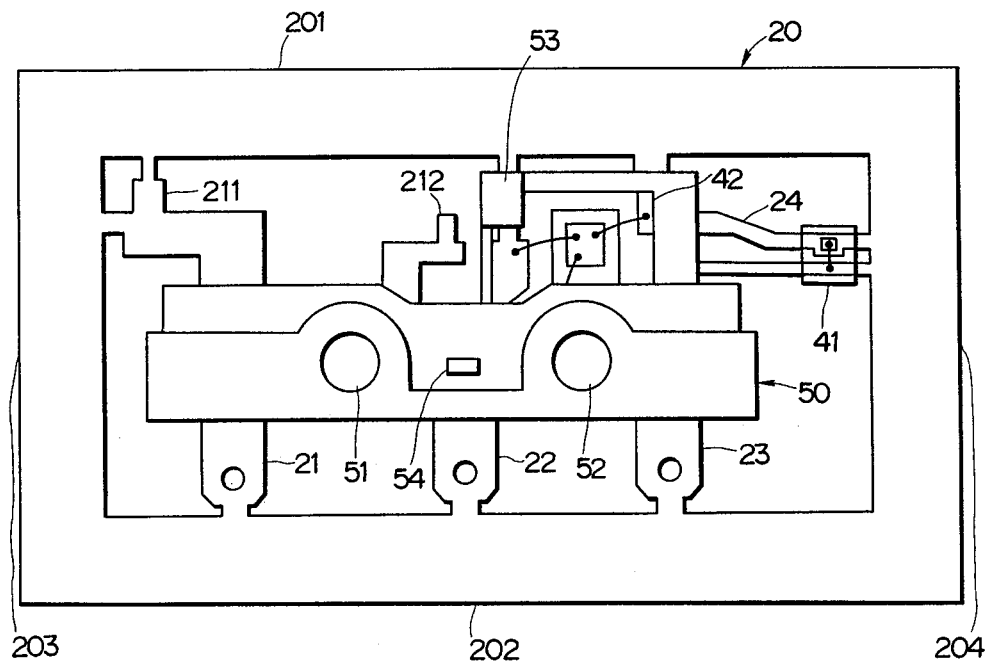

CONTACTLESS SNAP-ACTION PHOTOELECTRIC SWITCH

BACKGROUND OF THE INVENTION

This invention relates to a contactless switch and, more particularly, to a contactless snap action switch incorporating optical components and a process for fabricating the same, particularly on a high production scale.

A variety of snap action switches are known. The advantage of such switches is that their switching characteristics are independent of changes in environmental conditions such as temperature, humidity and so forth. Yet these switches have the disadvantage of relatively short useful lives, which are usually attributable to the aging or wear of the contacts. Optical switches utilizing a pair of light-emitting diode and photoelectric diode are also known. One of the advantages of an optical switch is its long serviceable life which results from the contactless construction employed.

It is an object of this invention to provide a contactless switch which is compact and simple in construction and which is easy to fabricate at low cost.

Another object is to provide a contactless snap action switch which is durable and which has stable characteristics.

A further object of this invention is to provide a method for fabricating such a contactless switch, particularly on a high production scale.

BRIEF DESCRIPTION OF THE DRAWINGS

FIG. 3 is a plan view showing terminal members with semiconductor chips set in place and covered with transparent plastic;

FIG. 4 is a plan view showing terminal members with an opaque plastic base thereon;

DESCRIPTION OF THE PREFERRED EMBODIMENTS

Figure 11:
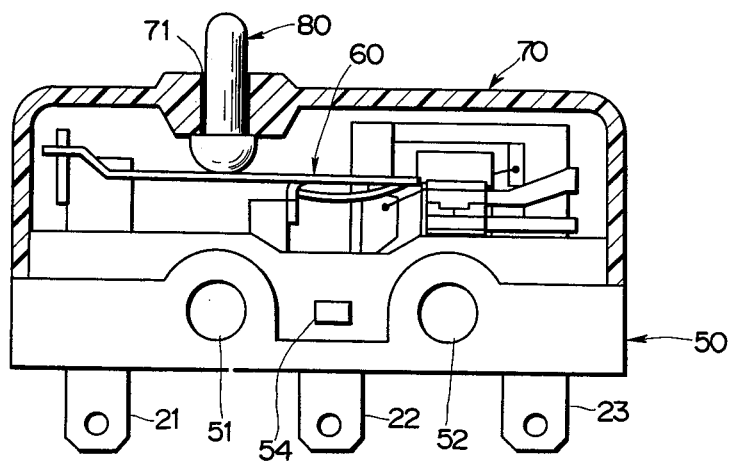
FIG. 11 is a plan view, in partial section, showing a contactless switch of this invention.

Referring to the drawings, FIG. 11 shows an example of the complete switch contemplated by the present invention, and FIG. 1 through FIG. 8 show a preferred method for fabricating such switch.

Figure 1:
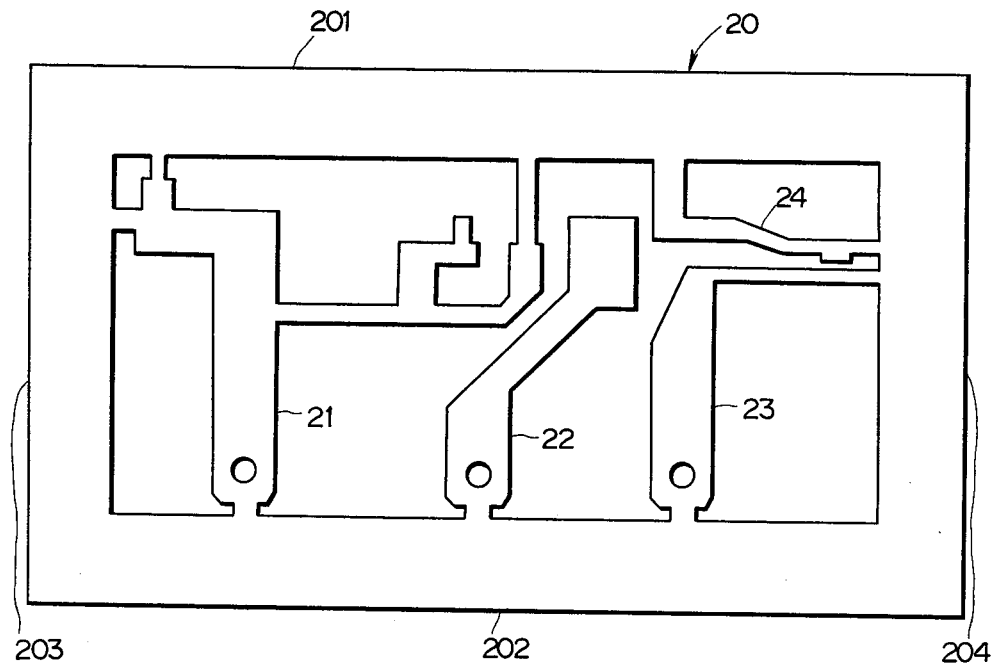
FIG. 1 is a plan view showing terminal members stamped in a metal strip.
Figure 2:
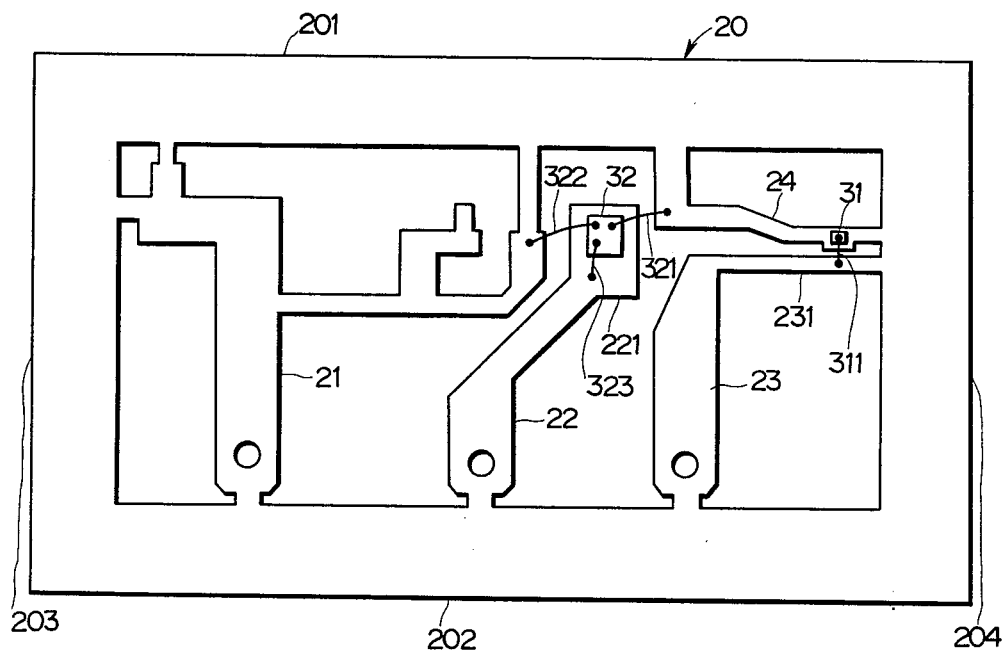
FIG. 2 is a plan view showing terminal members with a light-emitting diode chip and a photoelectric semiconductor chip secured in place.
Figure 5:
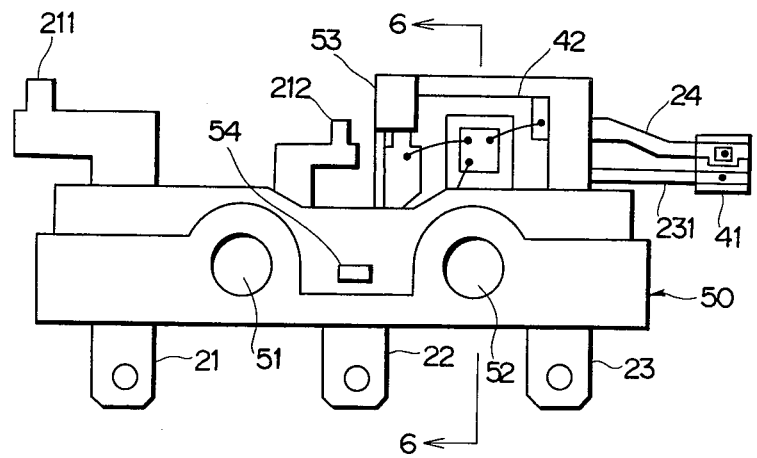
FIG. 5 is a plan view showing terminal members with peripheral webbing trimmed off.
Figure 6:
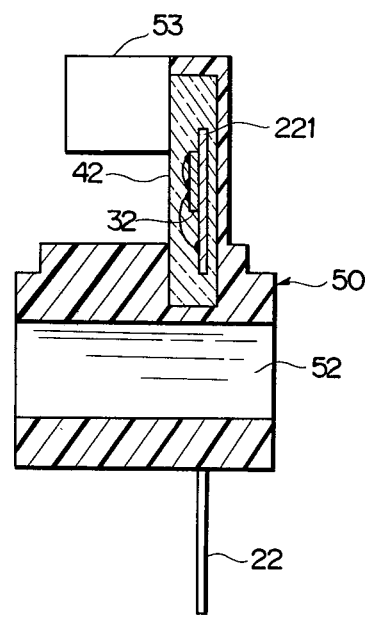
FIG. 6 is a sectional view taken along the line 6—6 of FIG. 5.
Figure 7:
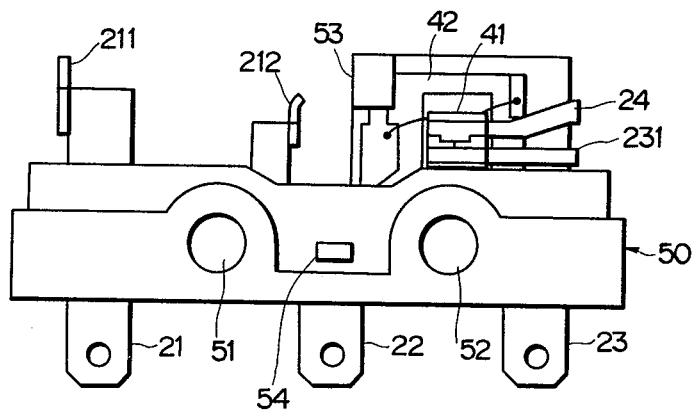
FIG. 7 is a plan view showing terminal members partially turned inward.

Referring, now, to FIG. 1, terminal members 21, 22, 23, and 24 are first stamped in a metal strip 20. Any number of units of such planar terminal members in a common plane can be stamped in a long metal strip simultaneously or continuously. As shown in FIG. 2, a light-emitting diode chip 31 and a photoelectric semiconductor chip 32 are mounted on terminal members 24, and 22, respectively, and wires 311, 321, 322, and 323 are applied for their electrical connections. The chip 32 includes at least one photoelectric transducing element, and other necessary elements such as amplifying circuit elements may be integrated therein. It should be mentioned that at least one of said chips 31 and 32 is mounted on any one of the terminal members. For example, only the photoelectric semiconductor device chip 32 may be mounted on the terminal member 22, with a light-emitting diode mounted on a separate metal plate and embedded in a transparent plastic material being connected to the terminal members 23 and 24 after a switch base 50, described hereinafter, has been molded to the terminal members. Protective covers 41 and 42 of electrically insulating transparent plastic are molded around the semiconductor chips 31 and 32, respectively, as illustrated in FIG. 3. A switch base 50 of electrically insulating opaque plastic is molded to the terminal members 21, 22, 23, and 24, as shown in FIG. 4. The periphery of the transparent plastic molding 42 is also covered with the opaque plastic molding 50, and a projection 53 is formed in a direction out of the plane of the figure. A pair of mounting holes 51 and 52 are provided in the base 50 for mounting the switch on any control apparatus or for ganging a plurality of switches. A projection 54 and another similar projection on the opposite side are also provided for securing a switch cover 70, described hereinafter, to the base 50. Peripheral webs 201, 202, 203, and 204 are then trimmed off, as shown in FIG. 5. FIG. 6 is a sectional view taken along the line 6—6 of FIG. 5. As shown in FIG. 7, two tabs 211 and 212 are turned inward and the tab 212 is further bent in the shape of a letter "L" so as to engage a shutter means 60. The terminal member 24 and a narrowed portion 231 of the terminal member 23 are also turned inward so that the light-emitting diode 31 confronts the photoelectric semiconductor chip 32. The shutter means 60 is then mounted on the terminal members, as shown in FIG. 8.

Figure 10:
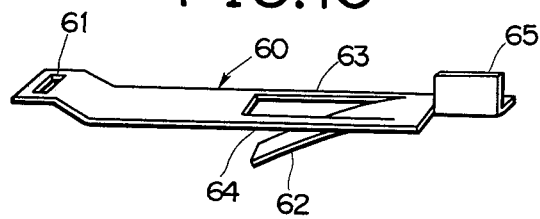
FIG. 10 is a perspective view of shutter means.

The shutter means 60, made of a single metal plate, comprises a hole 61, a compression section 62, a tension section 63, 64, and a light-blocking portion 65, as illustrated in FIG. 10. The hole 61 and compression section 62 are designed to engage tab 211 and tab 212, respectively.

Figure 8:
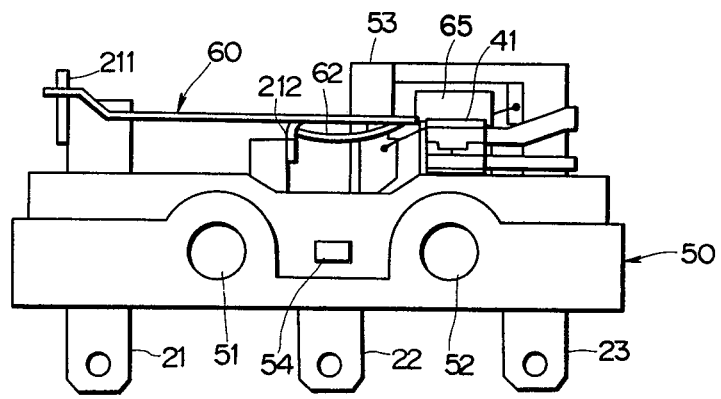
FIG. 8 is a plan view showing terminal members and shutter means engaged therewith.
Figure 9:
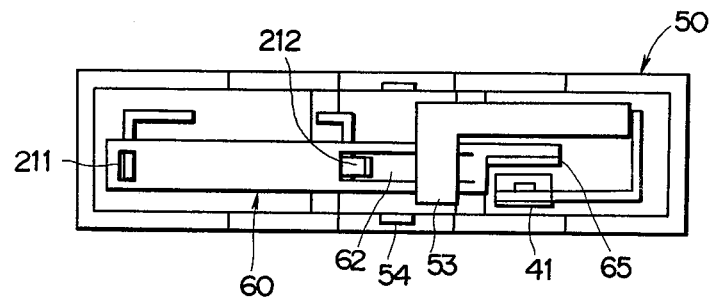
FIG. 9 is a top plan view of FIG. 8.

Referring, now, to FIG. 8 and to FIG. 9 which is a top-plan view of FIG. 8, it will be seen that the light-blocking portion 65 is positioned between light emitting diode 31 and photoelectric semiconductor chip 32, and, in its normal position, out of the light path from light-emitting diode 31 to photoelectric semiconductor chip 32. It should be understood that the light-blocking portion 65 may be formed as projecting downward so that it will be normally positioned in the light path. The counter-clockwise rotation of the shutter means 60 provided by the compression section 62 is restricted by a projection 53. As described hereinafter, the shutter means 60 provides a snap action to the switch. If desired, any other snap action mechanism known in the art may also be applied. A switch cover 70 molded from an opaque plastic material is secured to the base 50, as shown in FIG. 11. A push-button 80 for actuating the shutter means 60 is provided in a hole 71 of the switch cover 70. The push-button 80 is normally in a raised position as pressed by the shutter means 60.

Figure 12:
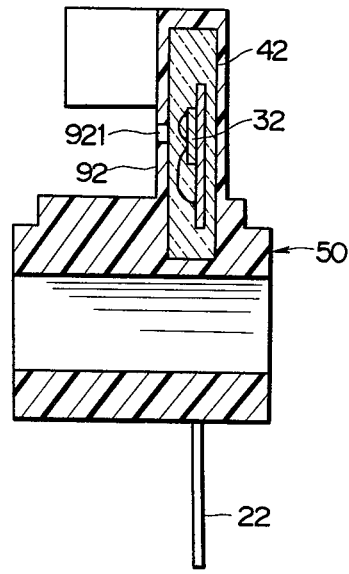
FIG. 12 is a sectional view similar to FIG. 6, showing another embodiment.

FIG. 12 shows another example of the molded base 50. The base 50 having a slit 921 extending in the direction out of the plane of the figure is molded to the transparent plastic molding 42 so that the molding 42 is further covered with a portion 92 of the opaque plastic base 50.

The photoelectric semiconductor device 32 receives light from the light-emitting diode through the slit 921. Such an opaque portion 92 having a slit 921 covering the photoelectric semiconductor device 32 for limiting the light path is not essential, but it contributes to a stable operation of the switch. An opaque plate having a slit may be substituted for the portion 92, as being disposed near the photoelectric semiconductor device or the light emitting diode.

Figure 13:
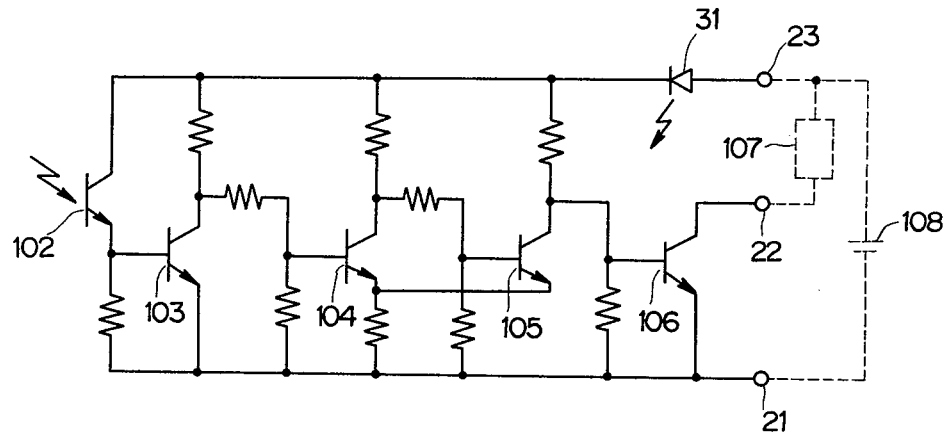
FIG. 13 shows an example of the electric circuitry of a photoelectric semiconductor device.

FIG. 13 shows an example of the circuitry applied to the switch. In the figure, a photoelectric transistor 102 receives light from light-emitting diode 31 and its output signal is amplified and waveformed by a circuit including transistors 103 through 106. The circuitry shown by the solid line is built into the switch described above and the part indicated by the dotted line, which includes a load 107 and a battery 108, is connected to the switch.

In the condition illustrated in FIG. 11, the snap action mechanism is in an unactuated condition. When the light-blocking portion 65 is positioned out of the light path, the photoelectric semiconductor device 32 receives light from the light-emitting diode 31. When the push-button 80 is depressed, the light-blocking portion 65 is still out of the light path during an initial movement of the push-button, but with a further movement thereof the light-blocking portion 65 is quickly rotated clockwise and positioned in the light path so that the photoelectric semiconductor device 32 cannot receive light from the light-emitting diode 31, even when the push-button 80 is slightly removed upward. When push-button 80 is released, light-blocking portion 65 snaps back out of the light path.

Figure 14:
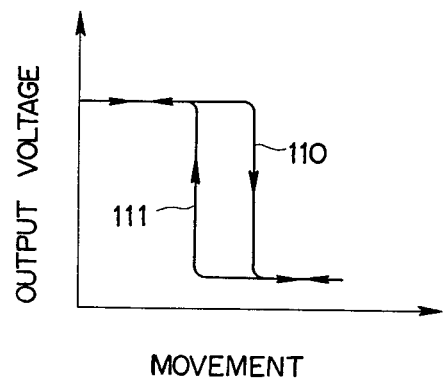
FIG. 14 is a graph showing the output voltage as a function of the stroke of a push-button.

FIG. 14 shows the operating characteristics of the switch. The output voltage between the terminals 21 and 22, shown in FIG. 13, changes as represented by a turning line 110 and returning line 111 with the movement of the push-button 80.

It will be apparent from the foregoing description that a compact contactless switch of unique construction amenable to easy mass production is provided by this invention.

What is claimed is:

1. A contactless switch comprising:
a switch base;
a plurality of planar terminal members formed in said base in a common plane;
a photoelectric semiconductor device mounted on one of said terminal members and electrically connected with plurality of said terminal members;
a light-emitting semiconductor device confronting said photoelectric semiconductor device and electrically connected with at least one of said terminal members;
a shutter means with a light-blocking portion movable in a space between said photoelectric semiconductor device and said light-emitting semiconductor device, said shutter means including a means for imparting a snap-action operation to the movement of said shutter means.

2. A contactless switch as claimed in claim 1, wherein said photoelectric semiconductor device and said light-emitting semiconductor device are each molded in a protective cover of transparent plastic material.

3. A contactless switch as claimed in claim 1, wherein said at least one of said terminal members is provided with at least one tab with which said shutter means is engaged.

4. A contactless switch as in claim 1, wherein said one of terminal members has a bent portion on which the light-emitting semiconductor device or photoelectric semiconductor device is mounted so that said light-emitting semiconductor device and said photoelectric semiconductor device are in confronting position.

5. A contactless switch as in claim 1, wherein said shutter means is movable in parallel with said common plane and capable of crossing the light path between the light-emitting semiconductor device and the photoelectric semiconductor device.

6. A contactless switch comprising:
a switch base of opaque plastic material;
a plurality of terminal members formed in said base in a common plane;
an integrated semiconductor device including at least a photoelectric transducing element mounted on one of said terminal members, electrically connected with a plurality of said terminal members and molded in a protective cover of transparent plastic material;
a light-emitting diode mounted on one of said terminal members, electrically connected with a plurality of said terminal members and molded in a protective cover of transparent plastic material;
a snap-action means for moving a shutter to temporarily block light passing from said light-emitting diode to said photoelectric element;
a switch cover for said switch base; and
an actuator for actuating said snap-action means.

* * * * *